United States Patent
Lu et al.

(10) Patent No.: US 7,452,816 B2
(45) Date of Patent: Nov. 18, 2008

(54) SEMICONDUCTOR PROCESSING METHOD AND CHEMICAL MECHANICAL POLISHING METHODS

(75) Inventors: Zhenyu Lu, Boise, ID (US); Naga Chandrasekaran, Boise, ID (US); Andrew Carswell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 11/494,401

(22) Filed: Jul. 26, 2006

(65) Prior Publication Data

US 2008/0026525 A1 Jan. 31, 2008

(51) Int. Cl.
*H01L 21/461* (2006.01)
*H01L 21/302* (2006.01)

(52) U.S. Cl. .............. 438/692; 438/690; 438/691; 438/693; 257/E21.304; 257/E21.583

(58) Field of Classification Search ........... 438/690, 438/691, 692, 693; 257/E21.304, E21.583
See application file for complete search history.

(56) References Cited

U.S. PATENT DOCUMENTS 6,936,540 B2 * 8/2005 Andreas ............... 438/690
2003/0162399 A1 8/2003 Singh
2005/0064712 A1 * 3/2005 Andreas ............... 438/692
2005/0076581 A1 4/2005 Small et al.
2005/0090109 A1 4/2005 Carter et al.
2005/0136669 A1 * 6/2005 Lee et al. ............. 438/690

* cited by examiner

*Primary Examiner*—Michael S. Lebentritt
*Assistant Examiner*—Mohsen Ahmadi
(74) *Attorney, Agent, or Firm*—Wells St. John P.S.

(57) ABSTRACT

This invention includes a chemical mechanical polishing method including providing a substrate having an organic material to be polished by chemical mechanical polishing. In one implementation, the organic material is chemical mechanically polished using a polishing pad downforce on the substrate of less than or equal to 1.75 psi, using an aqueous slurry comprising abrasive particles comprising an individual particle size of less than or equal to 100 nanometers and at a particle concentration of less than or equal to 20% by weight, and at least one of an acid or a surfactant effective to achieve a removal rate of the organic material of at least 500 Angstroms per minute. Other aspects and implementations are contemplated.

45 Claims, 1 Drawing Sheet

US 7,452,816 B2

SEMICONDUCTOR PROCESSING METHOD AND CHEMICAL MECHANICAL POLISHING METHODS

TECHNICAL FIELD

This invention relates to semiconductor processing methods and to chemical mechanical processing methods.

BACKGROUND OF THE INVENTION

Integrated circuits are typically fabricated within and upon semiconductor substrates, and commonly include deposition of materials upon the substrates. Some material deposited upon such substrates might be subjected to a polishing commonly referred to as chemical mechanical polishing. Such typically involves polishing a substrate with a polishing pad and a slurry provided between the pad and substrate. Both the pad and substrate typically rotate relative to one another, and the slurry includes solid abrasives and chemicals which remove material on the substrate being polished by both chemical and mechanical action.

Capacitors are one type of electronic device of an integrated circuit, for example of logic circuitry and of memory circuitry. In some circuitry, arrays of capacitors are formed. A manner of doing so includes forming openings within a material within which lower electrodes of the capacitors will be formed. Conductive capacitor electrode material, commonly metal, is deposited within the openings and over material within which the openings are formed. The conductive material typically lines yet incompletely fills the openings. Chemical mechanical polishing of the conductive material outwardly of the openings at least to the material under which the metal lies is commonly used to form cup-like/container-shaped capacitor electrodes within the openings. An organic material, such as photoresist, is typically deposited over and within the openings and polished in advance of polishing the capacitor electrode material. Organic material remaining in the openings is subsequently removed by an ashing or chemical etch. Thereafter, one or more capacitor dielectric layers, and outer capacitor electrode layers, are deposited.

It is, of course, desirable that the chemical mechanical polishing to form the isolated container-shaped electrodes occur at a suitably acceptable rate of removal of the photoresist and capacitor electrode layer to maximize the rate of production. The rate of removal is a function of many variables, a significant one of which includes downforce of the polishing pad against the material being polished. Accordingly, it is desirable to maintain sufficiently high downforce to achieve acceptably high rates of polishing. Unfortunately, high downforce can cause some of the material between the capacitor electrode openings to be displaced. This can cause scratching or cracking of the exterior surfaces of the capacitor electrode layers being formed by the chemical mechanical polishing action. Further, the polishing action against photoresist is typically much more mechanical than chemical. Such greater mechanical removing action, particularly in the removal of thick photoresist layers, can cause high mechanical shear forces against the capacitor containers being formed. This can lead to the shearing or breaking of the tops of some of the container-shaped electrodes, which is of course undesirable.

While the invention was motivated in addressing the above identified issues, it is in no way so limited. The invention is only limited by the accompanying claims as literally worded, without interpretative or other limiting reference to the specification, and in accordance with the doctrine of equivalents.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
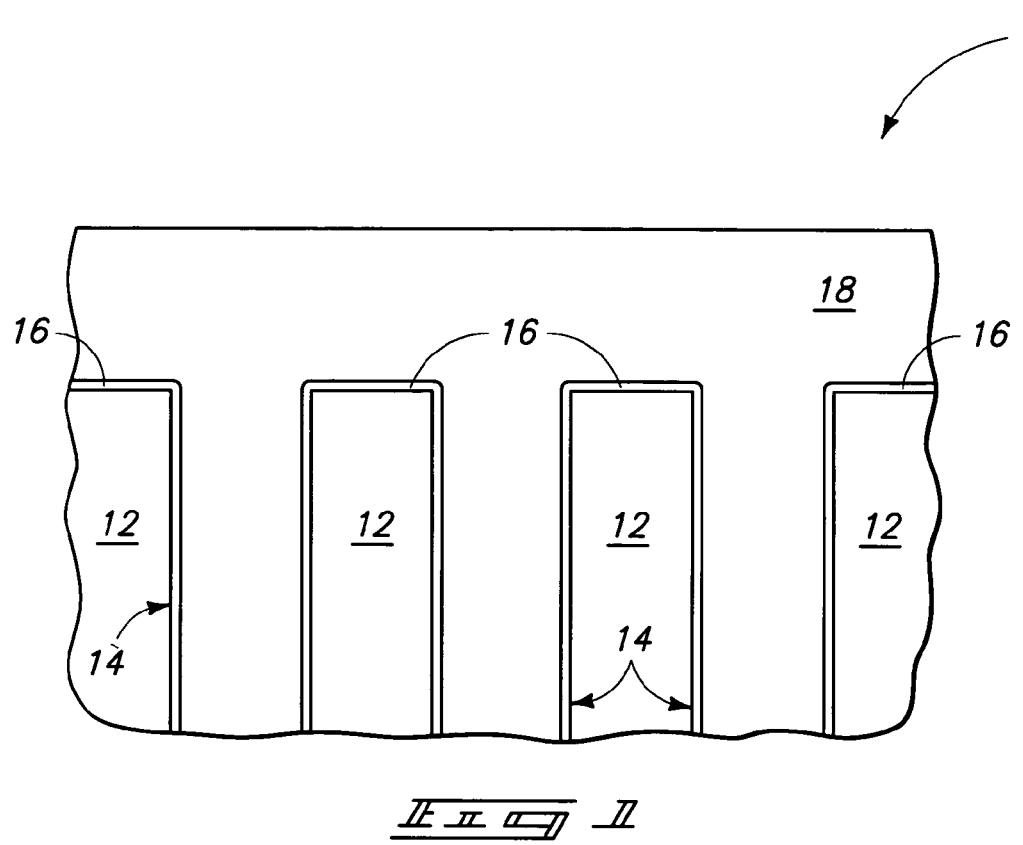
FIG. 1 is a diagrammatic section of a semiconductor substrate in process in accordance with an aspect of the invention.

Aspects of the invention encompass semiconductor processing methods and chemical mechanical polishing methods. By way of example only, a preferred semiconductor processing method, which includes chemical mechanical polishing, is described with reference to FIGS. 1 and 2. Referring initially to FIG. 1, a substrate is indicated generally with reference numeral 10. Such preferably comprises a semiconductor substrate, for example in the process of fabricating integrated circuitry which will include capacitors. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate fragment 10 is depicted as comprising a material 12 comprising an array of capacitor openings 14 formed therein. Material 12 would typically be formed over underlying substrate material (not shown), for example bulk semiconductor substrate material such as monocrystalline silicon, semiconductor-on-insulator substrates, and/or other substrates, and whether existing or yet-to-be developed. Material 12 might be entirely sacrificial, partially sacrificial, and/or include/remain as some part of the finished circuitry construction. Accordingly, material 12 might be insulative, semiconductive, and/or conductive, and of course comprise one or more different materials of discrete layers, discrete regions, or be homogeneous. An exemplary preferred material is doped silicon dioxide, for example borophosphosilicate glass (BPSG).

A capacitor electrode metal layer 16 has been formed over material 12 internally and externally of openings 14, and lines such openings (including the bases of such openings, which is not shown). In the context of this document "metal" refers to a conductive elemental metal, an alloy of elemental metals, or a conductive metal compound. An exemplary thickness for layer 16 is from 150 Angstroms to 350 Angstroms. In one preferred implementation, layer 16 comprises TiN. One particular example for layer 16 is a composite of an elemental titanium layer having a TiN layer deposited thereover. An organic material 18 is received over capacitor electrode metal layer 16 within openings 14 and externally of such openings over material 12. Exemplary preferred materials 18 include positive or negative organic photoresist. Additional or alternate exemplary organic materials include anti-reflective coatings (i.e., organic bottom anti-reflective coating materials)

and low K dielectrics. As used herein, a low K dielectric refers to material having a dielectric constant of less than about 3.5, such as fluorine, carbon, and/or nitrogen doped silica, nanoporous materials, and polymeric materials such as SiLk (manufactured by Dow Chemicals). By way of example only, an exemplary thickness range for material 18 is from 500 Angstroms to 1 micron.

Aspects of the invention encompass a semiconductor processing method which includes providing a semiconductor substrate comprising an array of capacitor openings formed within a suitable material, such as shown and described above by way of example only. However, aspects of the invention also include a chemical mechanical polishing method which includes providing a substrate, for example a semiconductor substrate, having an organic material to be polished by chemical mechanical polishing. By way of example only, the FIG. 1 depicted substrate is one such exemplary substrate. Alternate exemplary constructions, whether existing or yet-to-be developed, are also of course contemplated.

Figure 2:
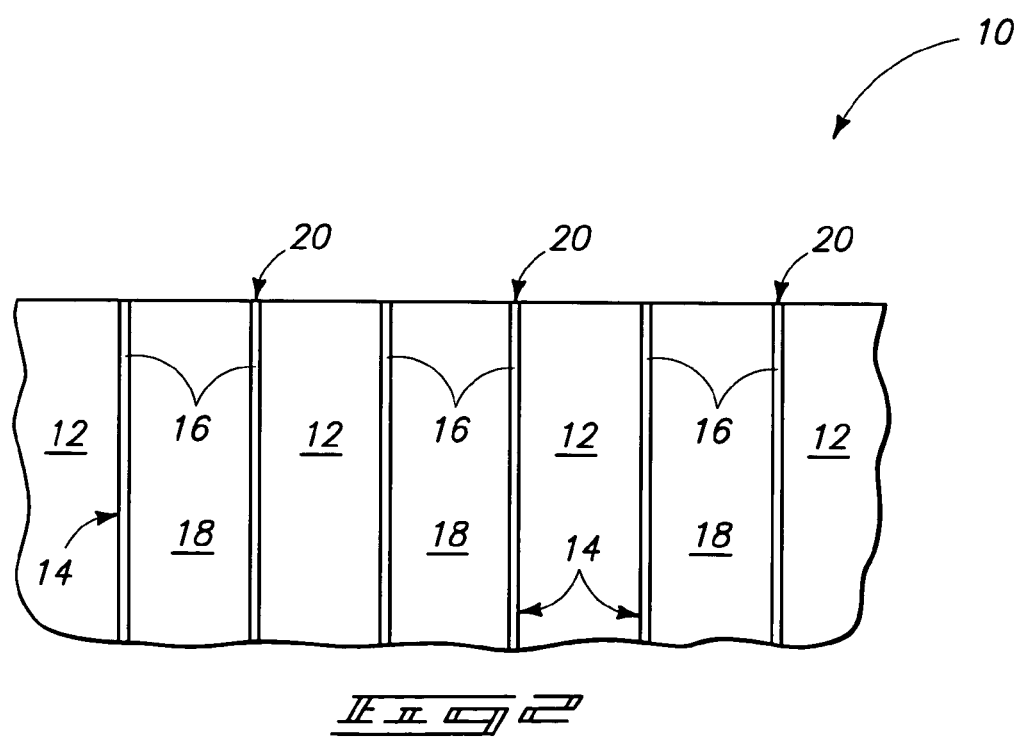
FIG. 2 is a view of the FIG. 1 substrate fragment at a processing step subsequent to that depicted by FIG. 1.

Referring to FIG. 2, organic material 18 and layer 16 have been chemical mechanical polished at least to material 12 forming isolated capacitor electrodes 20. In one implementation, such occurs by using a polishing pad and an aqueous slurry of pH of less than or equal to 4.0, and comprising abrasive particles having an individual particle size of less than or equal to 100 nanometers, and a particle concentration in the slurry of less than or equal to 20% by weight, effective to achieve a removal rate of material 18 of at least 500 Angstroms/minute. Acidic pH is preferred, particularly where a layer 16 to be polished which underlies organic material 18, is comprised of metal. If acidic, a more preferred pH is less than 3.5, with from 2.5 to 3 being a specific preferred example. Regardless, an aspect of the invention also encompasses chemical mechanical polishing organic material using a polishing pad downforce on the substrate of less than or equal to 1.75 psi using an aqueous slurry comprising abrasive particles comprising an individual particle size of less than or equal to 100 nanometers and at a particle concentration in the slurry of less than or equal to 20% by weight and at least one of an acid or a surfactant effective to achieve a removal rate of the organic material of at least 500 Angstroms/minute. Accordingly, certain aspects of the invention encompass any of utilizing a slurry which is acidic, contains a surfactant, or is both acidic and contains a surfactant. The acid utilized might be organic or inorganic. Preferred organic acids include carboxylic acids and sulfonic acids. Exemplary inorganic acids include nitric acid, phosphoric acid, and hydrochloric acid. One particular reduction-to-practice organic carboxylic acid is citric acid.

Any surfactant utilized might be cationic, anionic, nonionic, or zwitterionic. One exemplary preferred and reduction-to-practice surfactant is cetyl trimethyl ammonium bromide (CTAB). Combinations of different surfactants, including different category surfactants, might also be included. By way of example only, preferred critical micelle concentration (CMC) of any surfactant in solution, and regardless of whether of an acidic pH, is from $1\times10^{-2}$ to $1\times10^{-5}$ moles/liter.

Any suitable existing or yet-to-be developed abrasive particles might be utilized, with a preferred concentration range being from 0.1% to 20% by weight of the total solution, more preferably from 0.5% to 5% by weight, and even more preferably from 0.5% to 2.0% by weight. Exemplary preferred particles include colloidal silica, cerium oxide, and aluminum oxide. The particles also, of course, might be organic (for example polyethylene, polymethyl acrylic acid, polyurethane, etc.) or a combination of organic and inorganic particles, including organic or inorganic materials coated with the other of, or of different, organic or inorganic materials. A more preferred individual or primary particle size is from 6 nanometers to 100 nanometers, more preferably from 7 to 20 nanometers, and even more preferably from 10 to 15 nanometers, with 12 nanometers being a specific example. Such size, of course, refers to an average diameter of an individual particle. Regardless, individual particles might agglomerate even to sizes in excess of 100 nanometers (not preferred). Yet if agglomerated, a preferred or exemplary agglomeration comprises an agglomerated size of less than or equal to 50 nanometers.

Operation of a polishing pad during chemical mechanical polishing with such a preferred low downforce of no greater than 1.75 psi is understood to be atypical in the prior art, and certainly not in the context of achieving suitable chemical mechanical polishing removal rates of organic material of at least 500 Angstroms/minute. Further preferably, layer 16 in the depicted construction or some other metal layer received beneath an organic material being chemical mechanical polished in any other construction, is preferably removed at a rate of at least 300 Angstroms/minute. Regardless, and most preferably, polishing pad downforce is less than or equal to 1.5 psi, more preferably from 0.2 psi to 1.0 psi, and even more preferably from 0.3 psi to 0.6 psi, and still achieves a removal rate of the organic material of at least 500 Angstroms/minute. Further in one preferred implementation, slurries comprising a surfactant and a pH of from 2.5 to 3.0 and a pad downforce of less than 1.0 psi can achieve a removal rate of the organic material of at least 1 micron/minute and that of an underlying metal layer upon exposure of at least 300 Angstroms/minute. Further in one preferred implementation, slurries comprising a pH of from 2.5 to 3.0 and a pad downforce of less than 1.0 psi can achieve a removal rate of the organic material of at least 1 microns/minute and that of an underlying metal layer upon exposure of at least 400 Angstroms/minute (and with or without a surfactant). Further by way of example only, preferred polishing pads that are utilized have a hardness of from 10 to 90 ShoreA.

In one preferred implementation, where a metal layer to be polished underlies an organic layer being polished, the slurry preferably comprises an oxidizer of such metal layer in addition to any of the above stated acid and/or any surfactant. Preferred such oxidizers include peroxides, for example hydrogen peroxide, by way of example only. Further in one preferred implementation, particularly where a surfactant is utilized in the polishing slurry, the polishing pad is preferably treated with such surfactant, for example in the absence of other slurry materials but water, prior to starting the chemical mechanical polishing action. Regardless, a preferred oxidizer concentration is from 0.1% to 10% by weight of the slurry.

An exemplary preferred temperature during polishing is room ambient, with the slurry temperature perhaps being allowed to increase during polishing. Pressure is also preferably ambient room pressure. The slurry might additionally contain other materials, for example and by way of example only, any suitable inhibitor to prevent dishing of one or more of the materials being polished.

EXAMPLE ONE

A semiconductor substrate having an organic photoresist layer received over a titanium nitride layer was chemically mechanically polished. Ambient pressure during polishing was room ambient, and the temperature of the slurry started out at room ambient and was allowed to increase during the polishing. A CMP pad having a ShoreA hardness of 50~60 was utilized at a rotational speed of 80 rpm, with an opposite rotational speed of the substrate being polished of 70 rpm. A polishing pad downforce against the substrate being polished was 1.0 psi. During chemical mechanical polishing, slurry was flowed to atop the substrate being polished at a rate of 150 ml/minute. Such slurry comprised ~97.9 weight percent water, colloidal silica particles having an average diameter of 12 nanometers and present in the slurry at 1.0 weight percent. Slurry pH was ~2.9 and resulted, in part, from the addition of citric acid at a concentration in the slurry of 0.05 weight percent. Cationic cetyl trimethyl ammonium bromide was present in the solution at 0.001 weight percent, and hydrogen peroxide was present in the solution at a concentration of 1.0 weight percent. Chemical mechanical polishing in such manner achieved a removal rate of organic photoresist of more than 50,000 Angstroms/minute, and a removal rate of titanium nitride upon exposure of ~800 Angstroms/minute.

EXAMPLE TWO

A semiconductor substrate having an organic photoresist layer received over a titanium nitride layer was chemically mechanically polished. Ambient pressure during polishing was room ambient, and the temperature of the slurry started out at room ambient and was allowed to increase during the polishing. A CMP pad having a ShoreA hardness of 50~60 was utilized at a rotational speed of 80 rpm, with an opposite rotational speed of the substrate being polished of 70 rpm. A polishing pad downforce against the substrate being polished was 0.5 psi. During chemical mechanical polishing, slurry was flowed to atop the substrate being polished at a rate of 150 ml/minute. Such slurry comprised ~97.9 weight percent water, colloidal silica particles having an average diameter of 12 nanometers and present in the slurry at 1.0 weight percent. Slurry pH was ~2.9 and resulted, in part, from the addition of citric acid at a concentration in the slurry of 0.05 weight percent. Hydrogen peroxide was present in the solution at a concentration of 1.0 weight percent. Chemical mechanical polishing in such manner achieved a removal rate of organic photoresist of ~25,300 Angstroms/minute, and a removal rate of titanium nitride upon exposure of ~400 Angstroms/minute.

EXAMPLE THREE

A semiconductor substrate having an organic photoresist layer received over a titanium nitride layer was chemically mechanically polished. Ambient pressure during polishing was room ambient, and the temperature of the slurry started out at room ambient and was allowed to increase during the polishing. A CMP pad having a ShoreA hardness of 50~60 was utilized at a rotational speed of 80 rpm, with an opposite rotational speed of the substrate being polished of 70 rpm. A polishing pad downforce against the substrate being polished was 1.0 psi. During chemical mechanical polishing, slurry was flowed to atop the substrate being polished at a rate of 150 ml/minute. Such slurry comprised ~98 weight percent water, colloidal silica particles having an average diameter of 12 nanometers and present in the slurry at 1.0 weight percent. Cationic cetyl trimethyl ammonium bromide was present in the solution at 0.001 weight percent, and hydrogen peroxide was present in the solution at a concentration of 1.0 weight percent. Chemical mechanical polishing in such manner achieved a removal rate of organic photoresist of ~23,300 Angstroms/minute, and a removal rate of titanium nitride upon exposure of ~600 Angstroms/minute.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor processing method, comprising:
   providing a semiconductor substrate comprising an array of capacitor openings formed within a material, the substrate comprising a capacitor electrode metal layer received over the material internally and externally of the openings and lining the openings, an organic photoresist layer received over the capacitor electrode metal layer within the openings and externally of the openings; and
   chemical mechanical polishing the organic photoresist layer and the capacitor electrode metal layer at least to the material using a polishing pad and an aqueous slurry of pH of less than or equal to 4.0 comprising abrasive particles comprising an individual particle size of less than or equal to 100 nanometers and at a particle concentration of less than or equal to 20% by weight effective to achieve a removal rate of the organic photoresist layer of at least 500 Angstroms per minute.

2. The method of claim 1 wherein the slurry comprises a surfactant.

3. The method of claim 2 wherein surfactant is cationic.

4. The method of claim 3 wherein the surfactant comprises cetyl trimethyl ammonium bromide.

5. The method of claim 1 wherein the slurry comprises an oxidizer of the capacitor electrode metal layer in addition to the acid, and comprising chemical mechanical polishing the capacitor electrode metal layer at a rate of at least 250 Angstroms per minute.

6. The method of claim 1 wherein the abrasive particles comprise an individual particle size of from 10 nanometers to 15 nanometers.

7. The method of claim 6 comprising agglomerates of individual particles, said agglomerates comprising a size of less than or equal to 50 nanometers.

8. The method of claim 1 wherein the slurry comprises a particle concentration of from 0.5% to 5.0% by weight.

9. The method of claim 1 wherein the slurry comprises a particle concentration of from 0.5% to 2.0% by weight.

10. The method of claim 1 comprising a polishing pad downforce of less than or equal to 1.75 psi.

11. The method of claim 1 comprising a polishing pad downforce of from 0.2 psi to 1.0 psi.

12. The method of claim 1 comprising a polishing pad downforce of from 0.3 psi to 0.5 psi.

13. The method of claim 1 wherein the slurry comprises a surfactant and has a pH of from 2.5 to 3.0, and the removal rate of the organic photoresist is at least 1 micron per minute and removal rate of the metal layer is at least 300 Angstroms per minute at a polishing pad downforce of less than or equal to 1.0 psi.

14. The method of claim 1 wherein the slurry has a pH of from 2.5 to 3.0, and the removal rate of the organic photoresist is at least 2 microns per minute and removal rate of the metal layer is at least 400 Angstroms per minute at a polishing pad downforce of less than or equal to 1.0 psi.

15. A chemical mechanical polishing method, comprising:
   providing a substrate having an organic material to be polished by chemical mechanical polishing; and chemical mechanical polishing the organic material using a polishing pad downforce on the substrate of less than or equal to 1.75 psi, using an aqueous slurry comprising abrasive particles comprising an individual particle size of less than or equal to 100 nanometers and at a particle concentration of less than or equal to 20% by weight, and at least one of an acid or a surfactant effective to achieve a removal rate of the organic material of at least 500 Angstroms per minute.

16. The method of claim 15 wherein the organic material comprises photoresist received over a metal layer, the slurry comprising an acid and having pH of no greater than 4.0.

17. The method of claim 16 wherein the slurry comprises an oxidizer of the metal layer in addition to the acid and any surfactant, and comprising chemical mechanical polishing the metal layer at a rate of at least 250 Angstroms per minute.

18. The method of claim 15 comprising a polishing pad downforce of less than or equal to 1.5 psi.

19. The method of claim 15 comprising a polishing pad downforce of from 0.2 psi to 1.0 psi.

20. The method of claim 15 comprising a polishing pad downforce of from 0.3 psi to 0.6 psi.

21. The method of claim 15 wherein the organic material comprises an antireflective coating.

22. The method of claim 15 wherein the organic material comprises a low K dielectric.

23. The method of claim 15 wherein the abrasive particles comprise an individual particle size of from 10 nanometers to 15 nanometers.

24. The method of claim 23 comprising agglomerates of individual particles, said agglomerates comprising a size of less than or equal to 50 nanometers.

25. The method of claim 15 wherein the slurry comprises a particle concentration of from 0.5% to 5.0% by weight.

26. The method of claim 15 wherein the slurry comprises an acid.

27. The method of claim 15 wherein the slurry comprises an acid and has a pH less than or equal to 3.5.

28. The method of claim 15 wherein the slurry comprises a surfactant.

29. The method of claim 15 comprising treating the polishing pad with the surfactant prior starting said chemical mechanical polishing.

30. The method of claim 15 wherein the slurry comprises an acid and a surfactant.

31. A chemical mechanical polishing method, comprising:
providing a substrate having organic photoresist received over a TiN-comprising layer; and
chemical mechanical polishing the organic photoresist and the TiN-comprising layer using a polishing pad downforce on the substrate of less than or equal to 1.5 psi, using an aqueous slurry of pH of less than or equal to 3.5 comprising abrasive particles comprising an individual particle size of less than or equal to 20 nanometers and at a particle concentration of less than or equal to 5.0% by weight, an acid, and a surfactant effective to achieve a removal rate of the organic photoresist of at least 500 Angstroms per minute and of the TiN-comprising layer of at least 250 Angstroms per minute.

32. The method of claim 31 comprising treating the polishing pad with the surfactant prior starting said chemical mechanical polishing.

33. The method of claim 31 wherein the acid comprises a carboxylic acid.

34. The method of claim 33 wherein the carboxylic acid comprises citric acid.

35. The method of claim 31 wherein the surfactant comprises cetyl trimethyl ammonium bromide.

36. The method of claim 31 comprising chemical mechanical polishing effective to achieve a removal rate of the organic photoresist of at least 1 micron per minute and of the TiN-comprising layer of at least 300 Angstroms per minute.

37. The method of claim 31 wherein the particle concentration is less than or equal to 3.0% by weight, the polishing pad downforce is less than or equal to 1.0 psi and achieves a removal rate of the organic photoresist of at least 1 micron per minute.

38. The method of claim 31 wherein the surfactant is present in the slurry during chemical mechanical polishing at a CMC of from $1 \times 10^{-2}$ to $1 \times 10^{-5}$ moles per liter.

39. The method of claim 31 wherein the slurry comprises an oxidizer of the TiN-comprising layer.

40. The method of claim 39 wherein the oxidizer comprises a peroxide.

41. The method of claim 31 comprising chemical polishing with a polishing pad having a hardness from 10 to 90 ShoreA.

42. A chemical mechanical polishing method, comprising:
providing a substrate having an organic material received over a TiN-comprising layer; and
chemical mechanical polishing the organic material and the TiN-comprising layer using a polishing pad downforce on the substrate of less than or equal to 1.75 psi, using an aqueous slurry of pH of less than or equal to 4.0 comprising abrasive particles comprising an individual particle size of less than or equal to 100 nanometers and at a particle concentration of less than or equal to 20% by weight effective to achieve a removal rate of the organic material of at least 500 Angstroms per minute.

43. The method of claim 42 comprising a polishing pad downforce of less than or equal to 1.5 psi.

44. The method of claim 42 wherein the slurry comprises a particle concentration of from 0.5% to 2.0% by weight.

45. The method of claim 42 wherein the abrasive particles comprise an individual particle size of from 10 nanometers to 15 nanometers.

* * * * *